(12) United States Patent
Imai et al.

(10) Patent No.: US 8,841,744 B2
(45) Date of Patent: Sep. 23, 2014

(54) SEMICONDUCTOR APPARATUS

(75) Inventors: Tomohiro Imai, Matsumoto (JP); Masaharu Yamaji, Matsumoto (JP)

(73) Assignee: Fuji Electric Co., Ltd., Kawasaki (JP)

(*) Notice: Subject to any disclaimer, the term of this patent is extended or adjusted under 35 U.S.C. 154(b) by 0 days.

(21) Appl. No.: 13/448,739

(22) Filed: Apr. 17, 2012

(65) Prior Publication Data
US 2012/0267750 A1    Oct. 25, 2012

(30) Foreign Application Priority Data

Apr. 19, 2011 (JP) ................................. 2011-092568

(51) Int. Cl.
H01L 23/58    (2006.01)

(52) U.S. Cl.
USPC ............ 257/495; 257/491; 257/492; 257/493

(58) Field of Classification Search
USPC ........... 257/495, 491–493, E29.023; 438/570
See application file for complete search history.

(56) References Cited

U.S. PATENT DOCUMENTS 6,825,700 B2    11/2004 Hano
2005/0056906 A1*  3/2005 Jimbo et al. .................. 257/492

FOREIGN PATENT DOCUMENTS

| JP | 2001-144276 | 5/2001 |
| JP | 2003-332540 | 11/2003 |
| JP | 2004-200472 | 7/2004 |
| JP | 3941206 | 4/2007 |
| JP | 4610786 | 10/2010 |

* cited by examiner

*Primary Examiner* — Theresa T Doan

(57) ABSTRACT

A semiconductor apparatus having a bootstrap-type driver circuit includes a cavity for a SON structure formed below a bootstrap diode Db, and a p-type floating region formed in a $n^-$ epitaxial layer between a bootstrap diode Db and a p-type GND region at the ground potential (GND). The p-type floating region extends to the cavity for suppressing the leakage current caused by the holes flowing to the $p^-$ substrate in charging an externally attached bootstrap capacitor C1. The semiconductor apparatus which includes a bootstrap-type driver circuit facilitates suppressing the leakage current caused by the holes flowing to the $p^-$ substrate, when the bootstrap diode is biased in forward.

20 Claims, 13 Drawing Sheets

SEMICONDUCTOR APPARATUS

CROSS-REFERENCE TO RELATED APPLICATIONS

This application claims the priority benefit under 35 U.S.C. §119 of Japanese Application No. 2011-092568, filed Apr. 19, 2011, in the Japanese Intellectual Property Office, the disclosure of which is incorporated herein by reference.

BACKGROUND

1. Field

The present invention relates to semiconductor apparatuses which controllably drive power devices. Specifically, the invention relates to a semiconductor apparatus that includes a substrate, on which a driver circuit for driving a main circuit and a bootstrap diode for charging an external bootstrap capacitor are integrated. The main circuit includes a series circuit including an upper-arm output device, exhibiting a high breakdown voltage and connected to a high-voltage power supply, and a lower-arm output device, exhibiting a high breakdown voltage and connected to the ground potential (GND).

2. Description of the Related Art

The power devices are used in inverters for driving a motor. The power devices are used widely also in many fields such as large-capacity plasma displays panels (PDPs), power supplies for liquid-crystal display, and inverters for household electric appliances such as air conditioners and illuminations.

The power devices have been driven and controlled by an electronic circuit constituted by combining semiconductor devices such as a photocoupler and electronic parts such as a transformer. However, based on the progress in the large-scale integrated circuit (LSI) technologies, high-breakdown-voltage integrated circuit apparatuses exhibiting a high breakdown voltage of up to 1200 V are put into practical use in these days.

The high-breakdown-voltage integrated circuit apparatus is constituted by integrating a high-side gate diver IC for a power device, a control circuit, and the power device on a semiconductor substrate. The high-breakdown-voltage integrated circuit apparatuses are classified into series to improve the efficiencies of the inverters and to reduce the component parts thereof.

FIG. 11 is a block circuit diagram describing a power module that constitutes an inverter for driving a motor and a main-circuit-driver circuit (cf. the following Patent Document 1). The power devices which drive three-phase motor 70 constitute a bridge circuit and housed in a package such that power module 71 is constituted.

In FIG. 11, power module 71 is constituted of power devices including insulated-gate bipolar transistors (hereinafter referred to as "IGBTs") and diodes. MOSFETs may be used in substitution for the IGBTs with no problem. In FIG. 11, IGBTs Q1 through Q6 and diodes D1 through D6 are shown.

High-potential-side VCC2H of main power supply VCC2 is connected to the collectors of IGBTs Q1, Q2, and Q3. Low-potential-side VCC2L of main power supply VCC2 is connected to the emitters of IGBTs Q4, Q5, and Q6.

The gate of each IGBT is connected to the output from main-circuit-driver circuit 72. Input/output terminals I/O of main-circuit-driver circuit 72 are connected usually to a microcomputer. Outputs U, V, and W of an inverter constituted of power module 71 are connected to three-phase motor 70.

Main power supply VCC2 feeds a high AC voltage, usually from 100 V to 400 V. Especially when IGBTs Q4, Q5, and Q6 are in the OFF-states thereof but IGBTs Q1, Q2, and Q3 are in the ON-states thereof, the emitter potentials of IGBTs Q1, Q2, and Q3 are high.

Due to the potential scheme, the gates of IGBTs Q1, Q2, and Q3 should be driven by a voltage higher than the emitter potentials of IGBTs Q1, Q2, and Q3. Therefore, a photocoupler (PC) and a high-breakdown-voltage integrated circuit apparatus are used for main-circuit-driver circuit 72.

Usually, input/output terminals I/O of main-circuit-driver circuit 72 are connected to a microcomputer. The entire inverter circuit constituted of power module 71 is controlled by the microcomputer. Now an example of the high-breakdown-voltage integrated circuit apparatus will be described below.

FIG. 12 is a block diagram describing the arrangements of the constituent elements in the main-circuit-driver circuit.

Main-circuit-driver circuit 72 that constitutes the high-breakdown-voltage integrated circuit apparatus feeds and receives signals to and from the microcomputer via input/output terminals I/O. Main-circuit-driver circuit 72 includes control unit CU and gate driver units GDU. Control unit CU generates a control signal that makes a specific IGBT ON or OFF. Gate driver unit GDU receives the signal from control unit CU and drives the gate of the pertinent IGBT. Gate driver unit GDU detects an overcurrent caused in the pertinent IGBT and feeds an alarm signal to control unit CU.

Main-circuit-driver circuit 72 includes also a level shift unit LSU that mediates, between low-potential-level VCC2L and high-potential-level VCC2H, the gate signals and the alarm signals of IGBTs Q1, Q2, and Q3 connected to the high-potential-side of the bridge circuit in FIG. 11.

Gate driver unit GDU-U is connected to IGBT Q1, gate driver unit GDU-V to IGBT Q2, and gate driver unit GDU-W to IGBT Q3. Gate driver unit GDU-X is connected to IGBT Q4, gate driver unit GDU-Y to IGBT Q5, and gate driver unit GDU-Z to IGBT Q6.

Now level shift unit LSU in main-circuit-driver circuit 72 will be described below.

FIG. 13 is a block circuit diagram describing the fundamental structure of level shift unit LSU.

In the fundamental structure, n-channel MOSFET 61 exhibiting a high breakdown voltage, resistance RL1, p-channel MOSFET 62 exhibiting a high breakdown voltage, and resistance RL2 are used. The n-channel MOSFET 61 is used to shift the level of a signal from control unit CU to the levels of gate driver units GDU-U, GDU-Y, and GDU-W on high-potential-side VCC2H. The p-channel MOSFET 62 is used to shift the level of the alarm signal indicating an overcurrent and an overheat state to the level of control unit CU on low-potential-side VCC2L. Especially when the alarm signal indicating the detected overcurrent or the detected overheat caused in any of IGBTs Q1, Q2, and Q3 is designed not to be fed, p-channel MOSFET 62 will be unnecessary.

MOSFETs 61 and 62 used in level shift unit LSU are required to exhibit a breakdown voltage from 600 V to 1400, equivalent to the breakdown voltage of IGBTs Q1 through Q6 which drive three-phase motor 70.

Now a conventional high-breakdown-voltage gate driver that includes a bootstrap system formed on a semiconductor substrate (cf. the following Patent Document 2) will be described below.

FIG. 14 is a block circuit diagram describing the circuit configuration, in which gate driver units GDU-U and GDU-X in FIG. 12 which drive IGBT Q1 on the upper arm in FIG. 11, level shift unit LSU, and bootstrap diode Db are integrated into a chip.

FIG. 15 is a cross sectional view of a HV gate driver IC that includes an epitaxial substrate, on which a gate driver circuit and a bootstrap diode are integrated. Gate driver units GDU-V and GDU-W are constituted in the same manner.

In FIG. 14, the node for high-breakdown-voltage p-channel MOSFET 62 for detecting the overcurrent or the overheat caused in IGBT Q1 is not described. In FIG. 14, only the node of the level shift circuit on the level-up side of high-breakdown-voltage n-channel MOSFET 61 is described.

Now the operations of the bootstrap circuit will be described below.

A Vb voltage, which is the potential difference between a U-OUT pin and a U-VCC pin of the HV gate driver circuit, feeds a power supply to the high-side driver circuit. Usually, the Vb voltage is set to be around 15 V to securely enhance (turn ON and OFF) the external IGBTs (IGBTs Q1, Q2, and Q3) which the HV gate driver IC drives or the external MOSFETs.

The Vb voltage is the voltage of a floating power supply. In almost all the cases, the U-OUT voltage (V-OUT voltage, W-OUT voltage) having a square wave form at a high frequency is employed as a reference voltage. As shown in FIG. 14, the floating power supply is constituted of bootstrap diode Dd and bootstrap capacitor C1.

The bootstrap circuit works, when the U-OUT voltage drops to the ground potential in the state, in which a low-side IGBT (Q4) is in the ON-state thereof. Depending on the circuit configuration, the U-OUT voltage drops to the ground potential via the low-side IGBT or the load. As the U-OUT voltage drops to the ground potential, bootstrap capacitor C1 is charged by the VDD voltage, that is a low-voltage power supply of 15 V, via bootstrap diode Dd. As described above, a current is fed to bootstrap capacitor C1 from the VDD power supply so that the voltage of bootstrap capacitor C1, that is the Vb voltage of the floating power supply (high-side power supply), may be kept at the setting voltage (15 V).

In opposite, the U-OUT voltage is set to be equal to the U-VCC voltage or higher than the U-VCC voltage transiently due to a surge in the period, in which the gate of an IGBT (Q1) on the high-side is ON. Therefore, it is required for the reverse withstand voltage of bootstrap diode Db to be from 600 V to 1700 V, that is equivalent to the breakdown voltage of high-breakdown-voltage n-channel MOSFET 61.

Since it is necessary for bootstrap capacitor C1 to exhibit a large capacity of 100 nF or larger, it is difficult to integrate bootstrap capacitor C1. Therefore, an externally attached tantalum capacitor or an externally attached ceramic capacitor is used generally for bootstrap capacitor C1.

The following Patent Document 3 indicates that a pn-diode will be provided with a high breakdown voltage and hole leakage to the substrate will be reduced, if the pn-diode is formed using a silicon-on-insulator substrate (SOI substrate).

The following Patent Document 4 discloses a technique for forming a SON (silicon-on-nothing) structure. According to the disclosed technique, trenches are formed and aligned two-dimensionally in the surface of a silicon substrate and the silicon substrate is treated thermally to deform the trenches to a flat cavity. The disclosed technique prevents the manufacturing costs of the substrate from increasing and the reliability of the substrate from being impaired.

The following Patent Document 5 discloses a method for manufacturing a high-quality SON substrate with low manufacturing costs. The disclosed manufacturing method includes the first step of implanting ions for forming minute cavities in a desired region in a substrate, and the second step of thermally treating the substrate including the minute cavities formed therein. The second step of thermally treating is a step of exposing the substrate to a temperature of 1000° C. or higher. The Patent Document 5 discloses also a method of manufacturing a semiconductor apparatus exhibiting excellent performances, in which the manufacture of the SON substrate is inserted into the process of manufacturing the semiconductor apparatus.

DOCUMENTS DESCRIBING RELATED ART

[Patent Document 1] Japanese Patent Publication No. 3941206
[Patent Document 2] U.S. Pat. No. 6,825,700
[Patent Document 3] Japanese Unexamined Patent Application Publication No. 2004-200472
[Patent Document 4] Japanese Unexamined Patent Application Publication No. 2001-144276
[Patent Document 5] Japanese Unexamined Patent Application Publication No. 2003-332540
[Patent Document 6] Japanese Patent Publication No. 4610786

In the structure shown in FIGS. 14 and 15, the U-OUT voltage is pulled down to the ground potential, as a high-side IGBT (Q1) is made to be OFF, and bootstrap capacitor C1 is charged. Bootstrap diode Db has a structure that includes an $n^-$ layer, that is a Nepi layer, on an $n^+$ buried layer formed on a $p^-$ substrate, and a $p^+$ diffusion layer formed as an anode diffusion region.

Due to the structure described above, electrons are fed to the VDD power supply from the anode electrode of bootstrap diode Db and holes are fed to the cathode electrode of bootstrap diode Db at a low potential in the process of charging bootstrap capacitor C1.

In the low-voltage region, in which the forward voltage drop (VF voltage) of bootstrap diode Db is 2 V or lower, many holes penetrate the $n^+$ buried layer and flow into the $p^-$ substrate at the ground potential. As a result, in the period, in which the U-OUT voltage is pulled down to the ground potential and bootstrap capacitor C1 is charged, a large leakage current is caused from the high-potential-side terminal of the VDD power supply to the GND terminal of the $p^-$ substrate in the HV gate driver IC, causing current consumption increase.

FIG. 16 is a hole concentration distribution diagram describing the hole current (1h) paths obtained by a device simulation. The device simulation is conducted under the following conditions. The VDD power supply voltage is +15 V, the U-VCC voltage that feeds a current to capacitor C1 is +14 V, the forward voltage drop VF of bootstrap diode Db is 1 V, and the $p^-$ substrate is biased at the ground potential.

As FIG. 16 indicates, holes come off to the $p^-$ substrate via the $n^+$ buried layer from the anode region (VDD), that is the $p^+$ region of bootstrap diode Db, causing leakage currents Ileak.

Some holes are injected from the anode region, that is $p^-$ region, and taken into the cathode region. The holes taken into the cathode region recombine as minority carries with electrons. The other holes flow toward the $p^-$ substrate, fixed at the ground potential and the potential barrier of which is low. The hole component that recombines with electrons is smaller than the hole component that flows toward the $p^-$ substrate. As a result, leakage currents Ileak which flow to the $p^-$ substrate are caused.

FIG. 17 is a graph plotting the current that flows to the $n^+$ region and the current that flows to the $p^-$ substrate. In the structure, in which the active width W of bootstrap diode Db (the stripe-shaped $p^+$ region length) shown in FIG. 16 is set at 1000 μm and the active length L (the spacing between the n⁺ region and the p⁺ region) is set at 100 μm. The n⁺ region potential, that is the cathode region potential, is fixed at +14 V, the p⁻ substrate is fixed at the ground potential, the p⁺ region potential (VDD potential), that is the anode region potential, is raised from +14 V to +15 V, and the current that flows to the n⁺ region, that is the cathode region, and the current that flows to the p⁻ substrate are plotted in FIG. 17.

One knows from FIG. 17 that a current of 100 mA flows into the n⁺ region, that is the cathode region, and a leakage current of 40 mA into the p⁻ substrate, when the forward voltage VF of bootstrap diode Db is 1 V (when the anode voltage is 15 V, that is in the circle in FIG. 17).

The letter "E" in FIG. 17 represents a power of a number. For example, 1E-1 represents $1\times10^{-1}$. "Substrate Current" represents the hole current that flows to the p⁻ substrate.

The Patent Documents 1 through 4 describe nothing on the structure that includes a bootstrap diode formed in a silicon-on-nothing substrate (SON substrate) or in a silicon-on-insulator substrate (SOI), and a floating p-type region between the bootstrap diode and a p-type GND region for setting the substrate potential, by which to suppress the leakage current caused by the holes flowing to the p⁻ substrate.

In view of the foregoing, it would be desirable to obviate the problems described above. It would be also desirable to provide a semiconductor apparatus that includes a bootstrap diode integrated therein and facilitates suppressing the leakage current caused by the holes flowing to the p⁻ substrate, when the bootstrap diode is biased in forward.

SUMMARY

Additional aspects and/or advantages will be set forth in part in the description which follows and, in part, will be apparent from the description, or may be learned by practice of the invention.

According to a first aspect of the invention, there is provided a semiconductor apparatus including:

a semiconductor substrate of a p-type;

a semiconductor layer of an n-type formed on the semiconductor substrate;

a separation region of the p-type formed in the semiconductor layer from the surface of the semiconductor layer to the boundary between the semiconductor layer and the semiconductor substrate, the separation region zoning an island region;

a semiconductor device formed in the surface of the island region;

a cathode region of the n-type formed in a surface portion of the island region, the cathode region being between the separation region and the semiconductor device, the cathode region being spaced apart from the separation region and the semiconductor device;

an anode region of the p-type formed in the surface portion of the island region, the anode region being between the separation region and the cathode region, the anode region being spaced apart from the separation region and the cathode region;

an insulating separation region positioned below the cathode region, below the anode region, and below the region between the cathode region and the anode region, the insulating separation region being formed on the boundary between the semiconductor layer and the semiconductor substrate;

a first floating region of the p-type formed between the separation region and the anode region, the first floating region being spaced apart from the separation region and the anode region, the first floating region being formed in the semiconductor layer between the surface thereof and the insulating separation region; and the semiconductor substrate and the separation region being biased at a potential lower than the potentials of the anode region and the cathode region.

According to a second aspect of the invention, the insulating separation region is extended to the separation region. In embodiments of the invention, this second aspect may exist, for example, when the first aspect exists.

According to a third aspect of the invention, the insulating separation region is a cavity. In embodiments of the invention, this third aspect may exist, for example, when any one or combination of the first and second aspects exists.

According to a fourth aspect of the invention, the semiconductor apparatus further includes a second floating region of the p-type, the second floating region being between the cathode region and the semiconductor device, the second floating region being spaced apart from the cathode region and the semiconductor device, the second floating region being formed in the semiconductor layer between the surface thereof and the insulating separation region. In embodiments of the invention, this fourth aspect may exist, for example, when any one or combination of the first through third aspects exists.

According to a fifth aspect of the invention, the semiconductor apparatus further includes a contact region of the n-type formed in the surface portion of the semiconductor layer between the first floating region and the separation region. In embodiments of the invention, this fifth aspects may exist, for example, when any one or combination of the first through the fourth aspects exists.

According to a sixth aspect of the invention, the contact region is biased at the potential the same with the potential, at which the anode region is biased. In embodiments of the invention, this sixth aspect may exist, for example, when the fifth aspect exists.

According to a seventh aspect of the invention, there is provided a semiconductor apparatus including:

a semiconductor substrate of a p-type;

a semiconductor layer of an n-type formed on the semiconductor substrate;

a first separation region of the p-type formed in the semiconductor layer from the surface of the semiconductor layer to the boundary between the semiconductor layer and the semiconductor substrate, the first separation region zoning a first island region;

a second separation region of the p-type formed in the semiconductor layer from the surface of the semiconductor layer to the boundary between the semiconductor layer and the semiconductor substrate, the second separation region zoning a second island region, the second island region being spaced apart from the first island region;

a cathode region of the n-type formed in the surface portion of the first island region;

an anode region of the p-type formed in the surface portion of the first island region, the anode region being between the first separation region and the cathode region, the anode region being spaced apart from the first separation region and the cathode region;

an insulating separation region positioned below the cathode region, below the anode region, and below the region between the cathode region and the anode region, the insulating separation region being formed on the boundary between the semiconductor layer and the semiconductor substrate;

a first floating region of the p-type formed between the first separation region and the anode region, the first floating region being spaced apart from the first separation region and the anode region, the first floating region being formed in the semiconductor layer between the surface thereof and the insulating separation region;

a semiconductor device in the second island region, the semiconductor device being formed in the surface of the semiconductor layer; and the semiconductor substrate and the first separation region being biased at the potential lower than the potentials of the anode region and the cathode region.

According to an eighth aspect of the invention, the insulating separation region is extended to the first separation region. In embodiments of the invention, this eighth aspect may exist, for example, when the seventh aspect exists.

According to a ninth aspect of the invention, the insulating separation region is a cavity. In embodiments of the invention, this ninth aspect may exist, for example, when any one or combination of the seventh through eighth aspects exists.

According to a tenth aspect of the invention, the semiconductor apparatus further includes a bonding wire that connects the cathode region and the semiconductor device electrically. In embodiments of the invention, this tenth aspect may exist, for example, when any one or combination of the seventh through ninth aspects exists.

According to an eleventh aspect of the invention, the semiconductor apparatus further includes a contact region of the n-type formed in the surface portion of the semiconductor layer between the first floating region and the first separation region. In embodiments of the invention, this eleventh aspect may exist, for example, when any one or combination of the seventh through tenth aspects exists.

According to a twelfth aspect of the invention, the contact region is biased at the potential the same with the potential, at which the anode region is biased. In embodiments of the invention, this twelfth aspect may exist, for example, when the eleventh aspect exists.

According to the described embodiments of the invention, an insulating separation region is formed, under a bootstrap diode, of the cavity for a SON structure or an insulator film for a SOI substrate, and a p-type floating region extended to the insulating separation region is formed in the n⁻ epitaxial layer between the bootstrap diode and the p-type GND region biased at the ground potential. Due to the structure according to the described embodiments of the invention, the leakage current caused by the holes flowing to the p⁻ substrate in charging the externally attached bootstrap capacitor is suppressed.

BRIEF DESCRIPTION OF THE DRAWINGS

These and/or other aspects and advantages will become apparent and more readily appreciated from the following description of the embodiments, taken in conjunction with the accompanying drawings of which.

DESCRIPTION OF EMBODIMENTS

Figure 1:
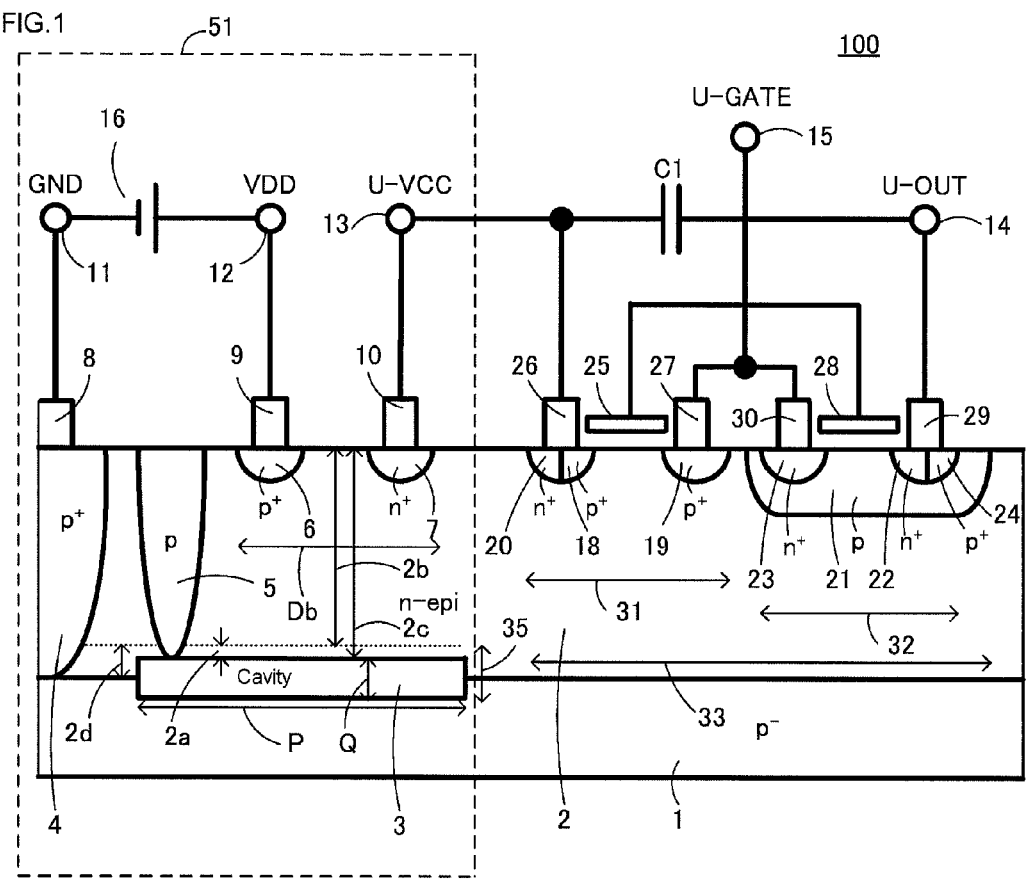
FIG. 1 is a cross sectional view of high-breakdown-voltage integrated circuit apparatus 100 according to a first embodiment of the invention.

Reference will now be made in detail to the embodiments, examples of which are illustrated in the accompanying drawings, wherein like reference numerals refer to the like elements throughout. The embodiments are described below to explain the present invention by referring to the figures.

First Embodiment

Figure 2A:
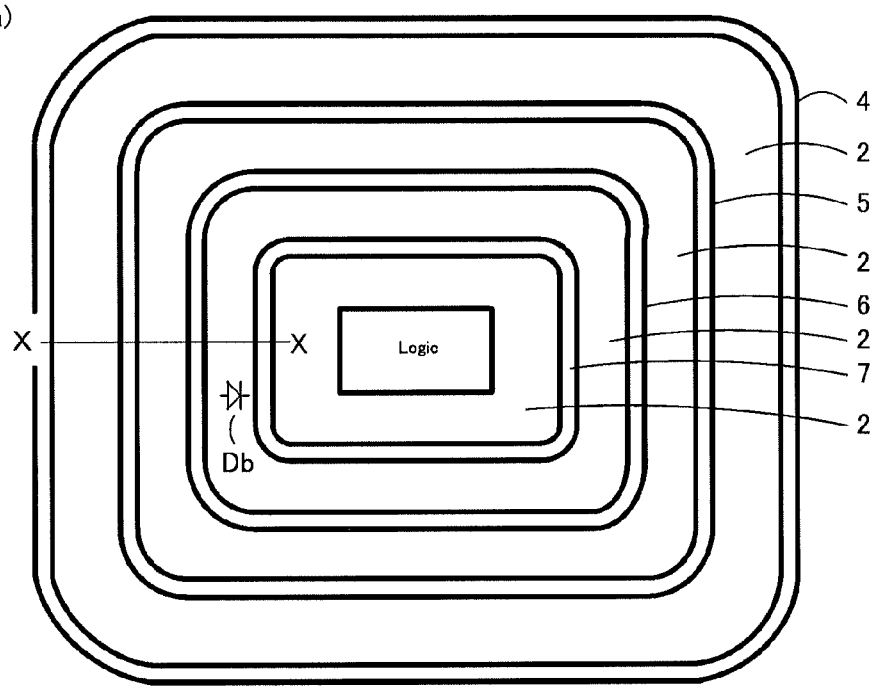
FIG. 2(a) is a top plan view describing bootstrap diode Db and the vicinity thereof.
Figure 2B:
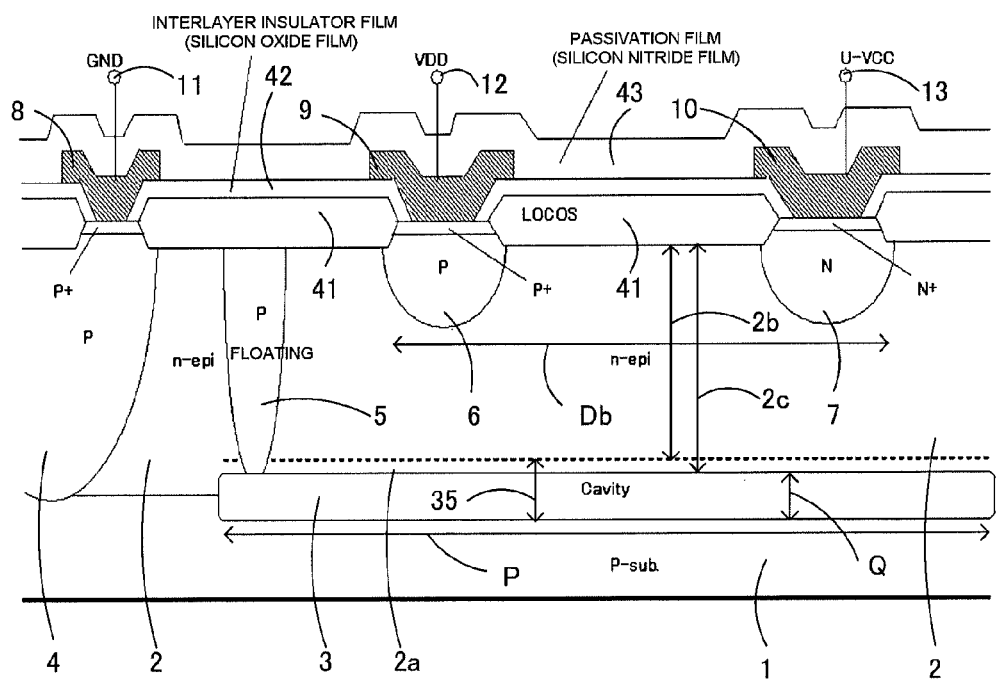
FIG. 2(b) is a cross sectional view along the line segment X-X in FIG. 2(a).
Figure 3:
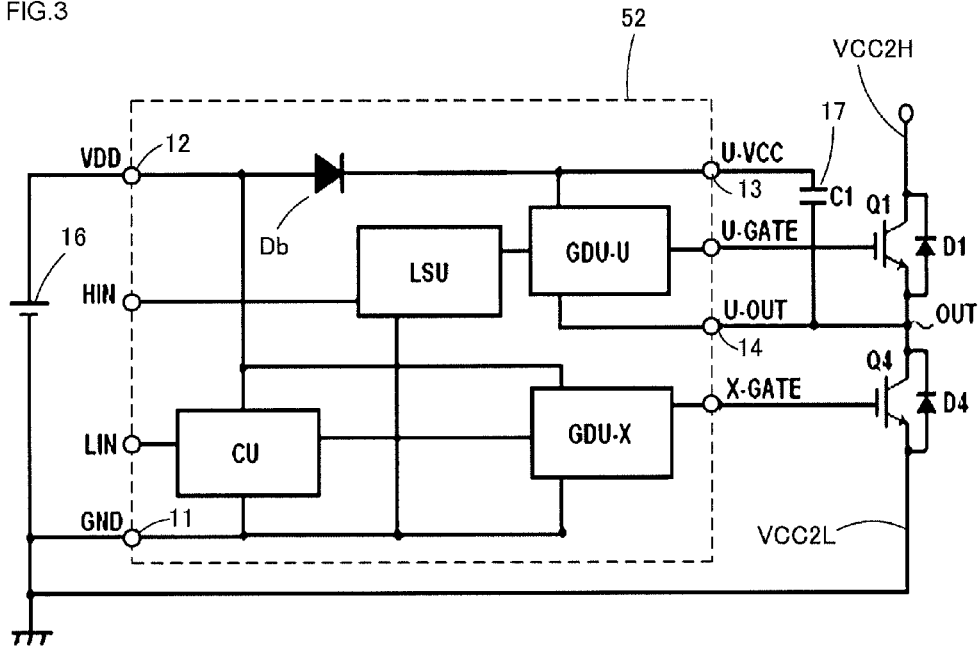
FIG. 3 is a block circuit diagram describing a main-circuit-driver circuit and a bootstrap diode circuit which constitute high-breakdown-voltage integrated circuit apparatus 100.

FIGS. 1 through 3 show the high-breakdown-voltage integrated circuit apparatus according to a first embodiment. FIG. 1 is a cross sectional view including a logic section. FIGS. 2(a) and 2(b) describe the structure of a bootstrap diode in the area surrounded by broken lines 51 in FIG. 1. FIG. 3 is the block circuit diagram of the entire circuit including a main circuit. A part of the area surrounded by the broken lines 52 in FIG. 3 is the cross sectional view shown in FIG. 1. Now the semiconductor apparatus according to the first embodiment will be described in detail below with reference to these drawings.

FIG. 1 is the cross sectional view of high-breakdown-voltage integrated circuit apparatus 100 according to the first embodiment of the invention. FIG. 1 is the cross sectional view showing a part of gate driver unit GDU of the U-phase section and an area related with the bootstrap diode.

In FIG. 1, high-breakdown-voltage integrated circuit apparatus 100 includes n⁻ epitaxial layer (epitaxially grown layer) 2 formed on p⁻ substrate 1, p-channel MOSFET 31 and p-type offset region 21 formed in the surface portion of n⁻ epitaxial layer 2, and n-channel MOSFET 32 formed in p-type offset region 21. CMOS circuit 33 in gate driver unit GDU is formed of p-channel MOSFET 31 and n-channel MOSFET 32 which are semiconductor devices. CMOS circuit 33 is a logic circuit.

In the surface portion of n⁻ epitaxial layer 2, n⁺ region 7 is formed such that n⁺ region 7 is spaced apart from CMOS circuit 33. In the surface portion of n⁻ epitaxial layer 2, p⁺ region 6 is formed such that p⁺ region 6 is spaced apart from n⁺ region 7. In the surface portion of n⁻ epitaxial layer 2, p-type floating region 5 is formed such that p-type floating region 5 is spaced apart from p⁺ region 6. Bootstrap diode Db is formed of n⁺ region 7 and p⁺ region 6. The n⁺ region 7 works as a cathode region and p⁺ region 6 as an anode region.

Spaced apart from p-type floating region 5, p-type GND region 4 is formed. In contact with p-type floating region 5, cavity 3 that constitutes SON structure 35 is formed in the surface portion of p⁻ substrate 1. SON structure 35 is extended underneath n⁺ region 7, which is the cathode region. The p-type GND region 4 is a p⁺ region for fixing p⁻ substrate 1 at the ground potential.

Now the method of manufacturing high-breakdown-voltage integrated circuit apparatus 100 will be described below.

Minute hole trenches are formed in the p⁻ substrate 1 surface. By thermally treating p⁻ substrate 1 with the hole trenches formed therein in a hydrogen atmosphere at 1000° C. or higher, SON structure 35 is formed in the surface portion of p⁻ substrate 1. Then, n⁻ epitaxial layer 2 is formed on the entire upper surface of p⁻ substrate 1. Then, p-type floating region 5, p-type GND region 4, bootstrap diode Db, and CMOS circuit 35 are formed in n⁻ epitaxial layer 2.

When n⁻ epitaxial layer 2 is formed, the surface portion of p⁻ substrate 1 is inverted to n⁻ semiconductor layer 2d. The semiconductor layer (the layer called a "CAP layer") on cavity 3, which constitutes SON structure 35, also becomes n⁻ semiconductor layer 2a, which is contained in n⁻ semiconductor layer 2d. Although n⁻ epitaxial layer 2 is n⁻ semiconductor layer 2b originally, n⁻ epitaxial layer 2 is described as a layer including n⁻ semiconductor layer 2d for the convenience of description. In other words, n⁻ epitaxial layer 2 is described as a layer formed of n⁻ semiconductor layer 2b and n⁻ semiconductor layer 2d.

The n⁻ semiconductor layer 2c that occupies the entire region on cavity 3 is formed of n⁻ semiconductor layer 2a and n⁻ semiconductor layer 2b. If the CAP layer is so thick that n⁻ semiconductor layer 2a is not extended to cavity 3 or if one wants to dope n⁻ semiconductor layer 2d more heavily than n⁻ semiconductor layer 2b, it is effective to diffuse an n-type impurity into n⁻ semiconductor layer 2d at a high concentration.

The p-type GND region 4 is connected to GND terminal 11 and p⁺ region 6 is connected to VDD terminal 12. The n⁺ region 7 is connected to U-VCC terminal 13, and U-VCC terminal 13 is connected to the high-potential-side of bootstrap capacitor C1 attached externally and to p-type source region 18 of p-channel MOSFET 31 that constitutes CMOS circuit 33. The low-potential-side of bootstrap capacitor C1 is connected to n-type source region 22 of n-channel MOSFET 32 that constitutes CMOS circuit 33 and further to U-OUT terminal 14. The p-type drain region 19 of p-channel MOSFET 31 and n-type drain region 23 of n-channel MOSFET 32 are connected to each other and connected to U-GATE terminal 15.

CMOS circuit 33 is a high-side circuit and formed in a floating potential region at a high potential. VDD terminal 12 is a high-potential-side terminal of a control power supply that drives the low-side circuit. The control power supply is a low-voltage power supply. U-VCC terminal 13 is a high-potential-side terminal of a control power supply that drives the high-side circuit. The U-VCC terminal 13 potential is almost the same with the high-potential-side potential of VDD power supply 16 with the intermediate potential of U-OUT terminal 14 as a reference. The intermediate potential of U-OUT terminal 14 fluctuates between high-potential-side potential VCC2H and low-potential side potential VCC2L of high voltage power supply VCC2, that is a main circuit power supply. Although the above descriptions are made on the U-phase, the similar descriptions may be made on the V- and W-phases.

In FIG. 1, electrodes 8, 9, 10, 26, 27, 29, and 30 are connected to the respective regions. In FIG. 1, gate electrodes 25 and 28 are shown. In FIG. 1, n-type contact region 20 and p-type contact region 24 are shown. In the surface portion of p-type GND region 4, a p⁺ region is formed as a contact region. In the anode region, p⁺ region 6 is formed as a contact region in the surface portion of a p-type region. In the cathode region, n⁺ region 7 is formed as a contact region in the surface portion of an n-type region.

In FIGS. 2(a) and 2(b), gate river unit GDU and bootstrap diode Db formed in the breakdown withstanding section surrounding gate river unit GDU are shown. FIG. 2(a) is a top plan view and FIG. 2(b) a cross sectional view along the line segment X-X in FIG. 2(a).

Cavity 3 is formed in a portion between p⁻ substrate 1 and n⁻ epitaxial layer 2. In contact with cavity 3, p-type floating region 5 is formed. Surrounded by p-type floating region 5, p⁺ region 6 that will work as an anode region is formed. Surrounded by p⁺ region 6, n⁺ region 7 that will work as a cathode region is formed. A p-type GND region 4 that reaches p⁻ substrate 1 is formed and p-type floating region 5 is surrounded by p-type GND region 4. The logic section (indicated by "Logic" in FIG. 2(a)) on the high-side is surrounded by n⁺ region 7 that is the cathode region. The logic section is constituted of CMOS circuit 33 in FIG. 1 and such circuits. Gate river unit GDU-U in FIG. 3 is included in the logic section.

LOCOS 41 is formed in the n⁻ epitaxial layer 2 surface. In the openings of LOCOS 41, GND electrode 8 connected to p-type GND region 4, anode electrode 9 connected to p⁺ region 6, and cathode electrode 10 connected to n⁺ region 7 are formed. GND terminal 11 is connected to GND electrode 8, VDD terminal 12 to anode electrode 9, and U-VCC terminal 13 to cathode electrode 10.

FIG. 3 is a block circuit diagram describing a main-circuit-driver circuit and a bootstrap diode circuit which constitute high-breakdown-voltage integrated circuit apparatus 100.

In FIG. 3, upper-arm output device Q1 (U-phase) and lower-arm output device Q4 (X-phase) which constitute a main circuit and diodes D1 and D4 connected in opposite parallel to output devices Q1 and Q4, respectively, are shown.

In FIG. 3, the main-circuit-driver circuit is formed in high-breakdown-voltage integrated circuit apparatus 100 called a "HV gate driver IC". The HV gate driver IC is a circuit that drives the gates of upper-arm output device Q1 and lower-arm output device Q4 which constitute a main circuit (shown by the U- and X-phases of a three-phase inverter circuit in FIG. 3). The connection point of upper-arm output device Q1 and lower-arm output device Q4 is intermediate point terminal OUT of the main circuit. Intermediate point terminal OUT is connected to U-OUT terminal 14 of high-breakdown-voltage integrated circuit apparatus 100 and to a not-shown load (such as a motor). U-OUT terminal 14 (terminal OUT) is at an intermediate potential, which fluctuates between high-potential-side potential VCC2H and low-side potential VCC2L of a high-voltage power supply VCC that is a main circuit power supply.

Now an example, in which IGBTs are used for upper-arm output device Q1 and lower-arm output device Q4, will be described below. In substitution for the IGBTs, MOS-type field effect transistors (MOSFETs), gate-turnoff thyristors (GTOs), static-induction-type transistors (SITs), static-induction (SI) thyristors, and such output devices may be used with no problem.

Figure 11:
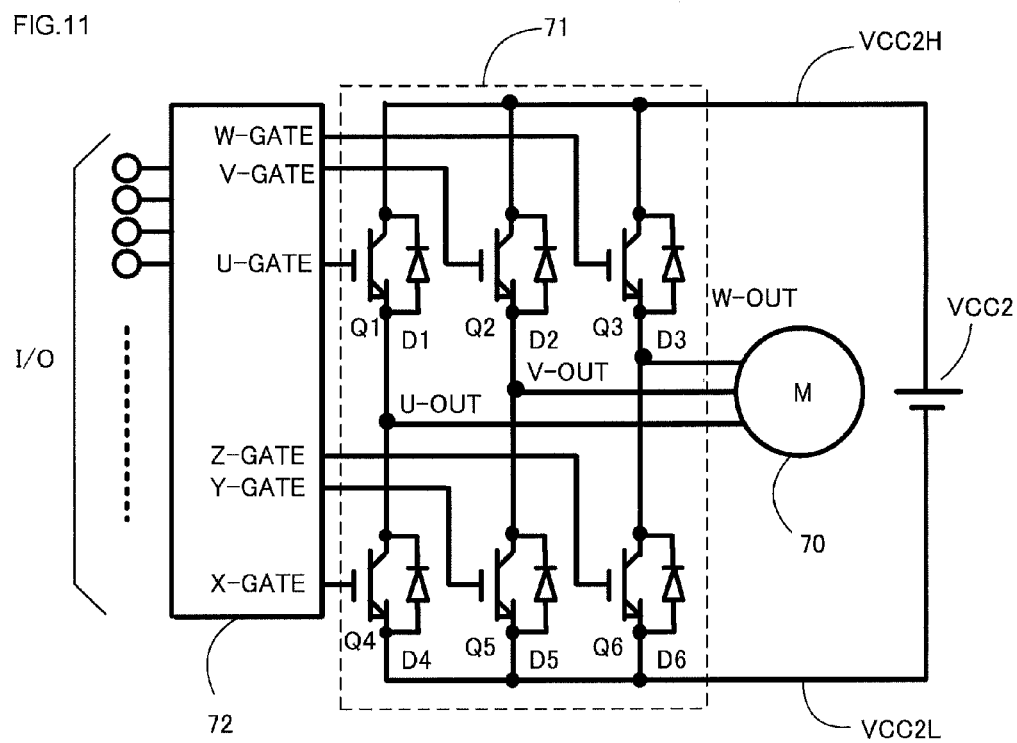
FIG. 11 is a block circuit diagram describing a power module that constitutes an inverter for driving a motor and a main-circuit-driver circuit.

The collector electrode of upper-arm output device Q1 is connected to high-potential-side terminal (VCC2H terminal) of high-voltage power supply VCC2. The emitter electrode of lower-arm output device Q4 is connected to a GND terminal (VCC2L terminal) at the ground potential. The emitter electrode of upper-arm output device Q1 and the collector electrode of lower-arm output device Q4 are connected to intermediate point terminal OUT biased at an intermediate potential. Intermediate point terminal OUT is connected to a not-shown load. To intermediate point terminals OUT for the respective phases, a U-OUT terminal, a V-OUT terminal, and a W-out terminal are connected, respectively, as shown in FIG. 11.

Upper-arm diode D1 (reflux diode) is connected in opposite parallel to upper-arm output device Q1. Lower-arm diode D4 (reflux diode) is connected in opposite parallel to lower-arm output device Q4.

As shown in FIG. 3, upper-arm output device Q1 is driven by upper-arm driver GDU-U in the floating state (floating potential state). In other words, output terminal U-GATE of upper-arm driver GDU-U in the HV gate driver IC is connected to the control electrode of upper-arm output device Q1 attached externally.

Output terminal X-GATE of lower-arm driver GDU-X in the HV gate driver IC is connected to the control electrode of lower-arm output device Q4 attached externally. Upper-arm driver GDU-U is connected between the high-potential-side terminal (U-VCC terminal 13) of the U-VCC power supply, that is an internal power supply, and the intermediate point terminal OUT (U-OUT terminal 14) and a predetermined power supply voltage (C1 voltage=VDD voltage) is fed to upper-arm driver GDU-U. Upper-arm driver GDU-U is a high-side circuit at a high floating potential. Lower-arm-driver GDU-X is a low-side circuit fixed at a low potential.

Figure 12:
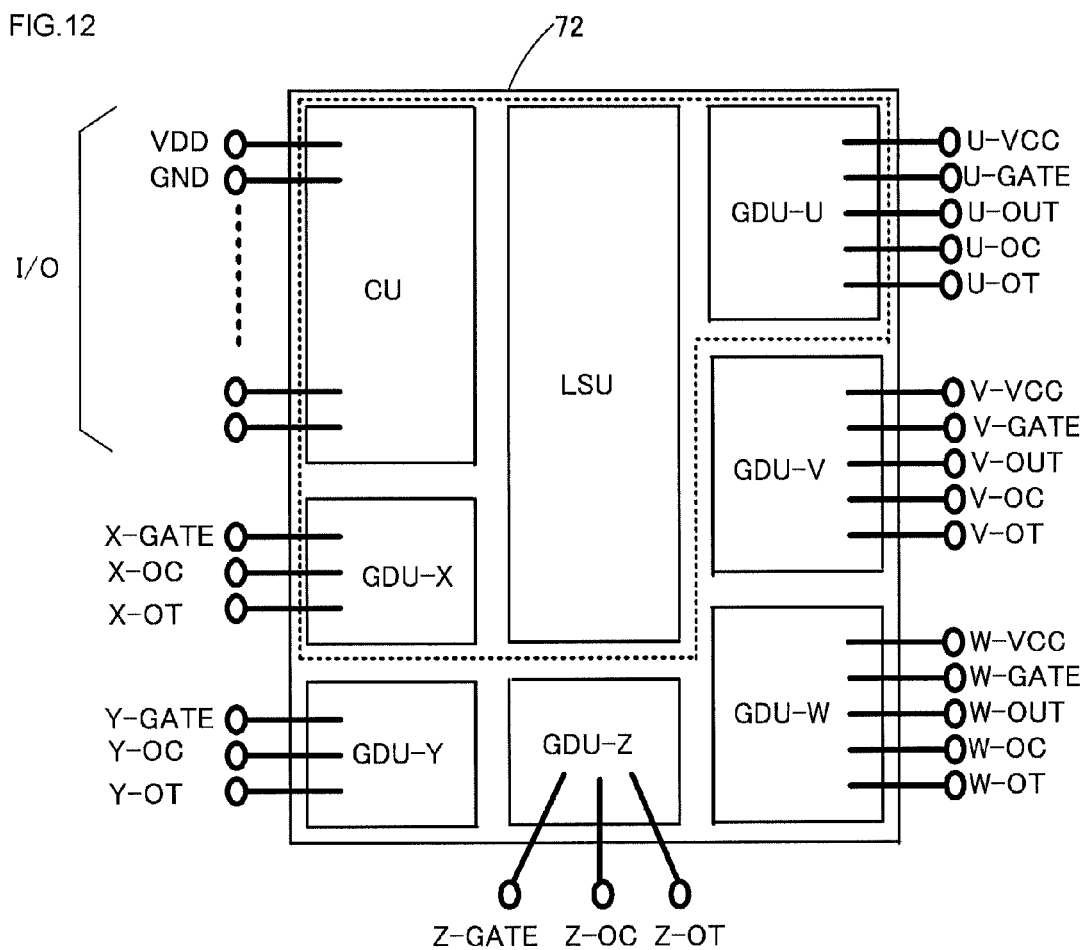
FIG. 12 is a block diagram describing the arrangements of the constituent elements in the main-circuit-driver circuit.
Figure 13:
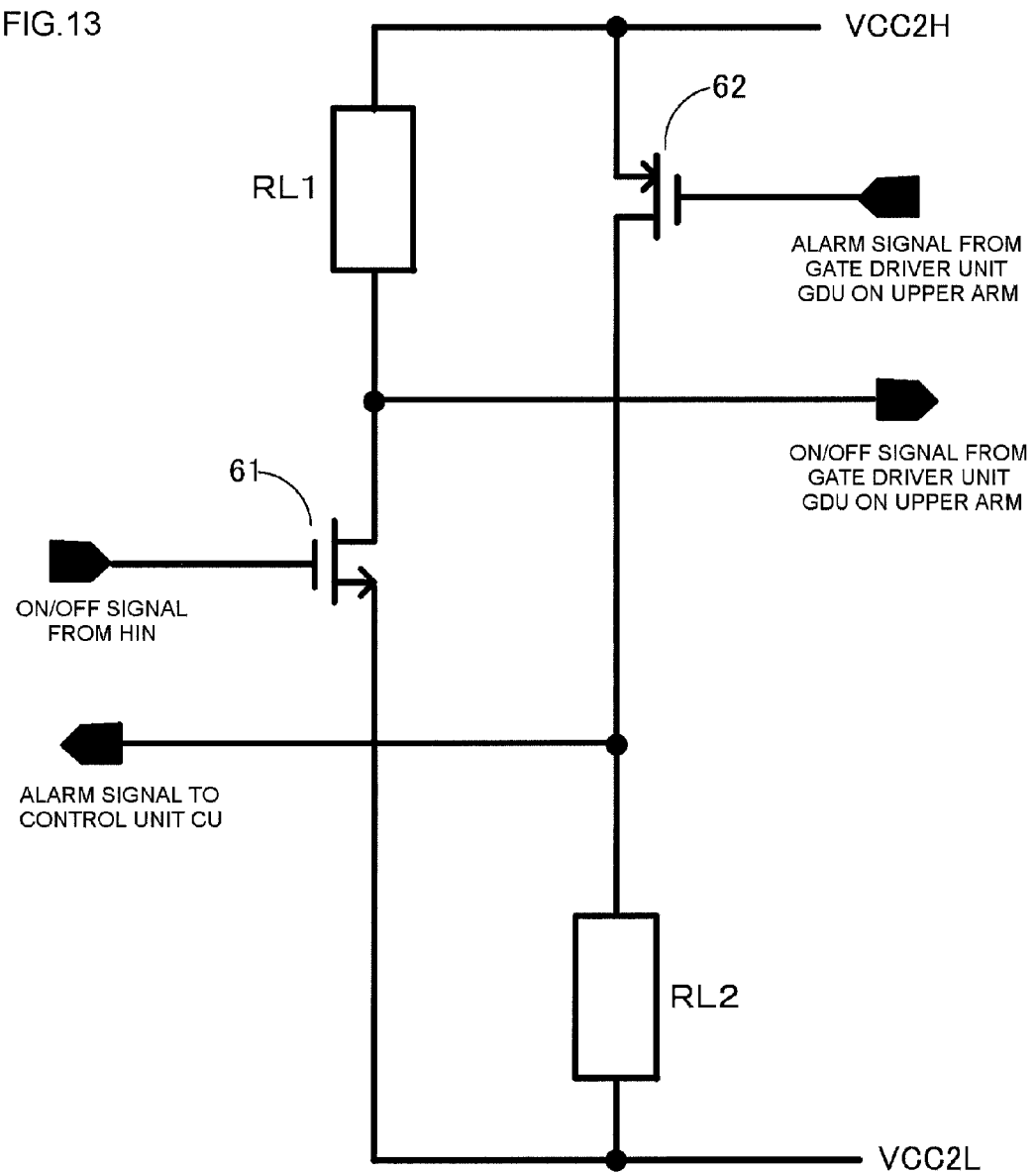
FIG. 13 is a block circuit diagram describing the fundamental configuration of a level shift unit.
Figure 14:
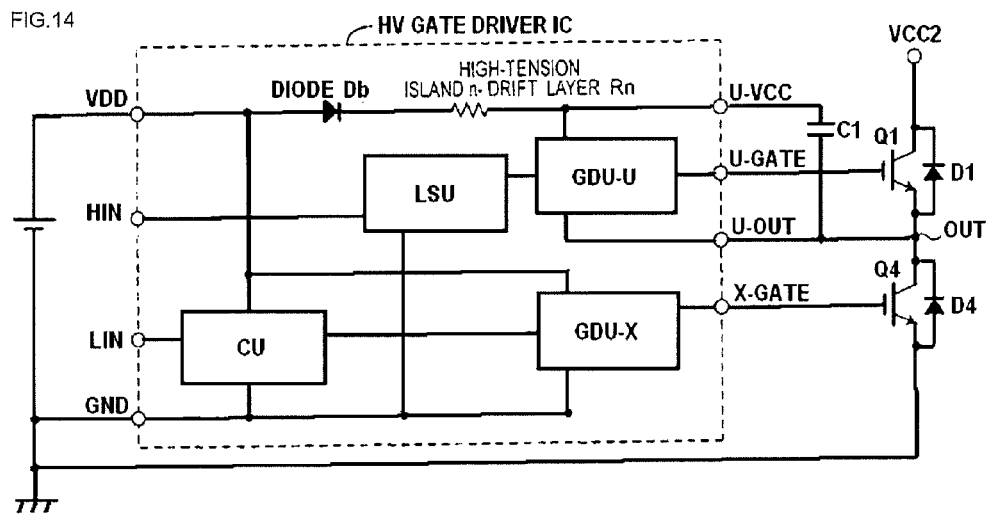
FIG. 14 is a block circuit diagram describing the circuit configuration, in which the gate driver units (GDU-U and GDU-X) in FIG. 12 that drive an IGBT (Q1) on the upper arm in FIG. 11, level shift unit LSU, and a bootstrap diode (Db) are integrated into a chip.
Figure 15:
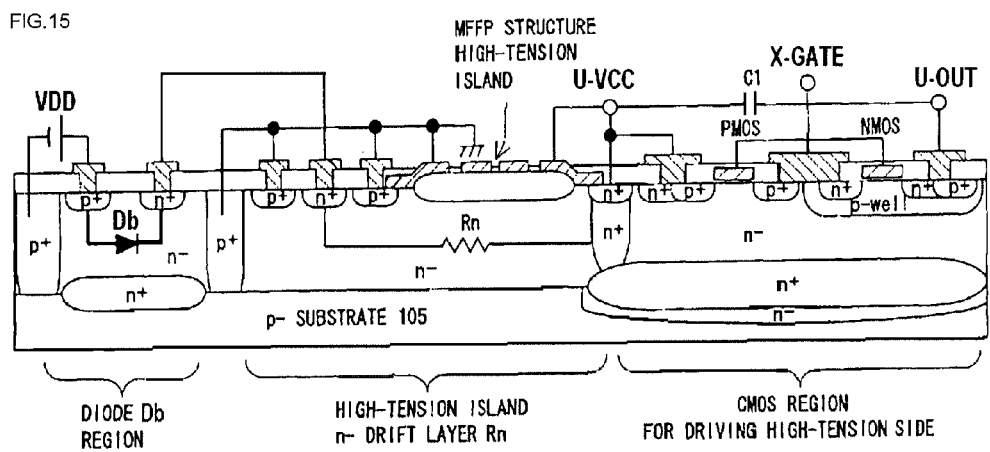
FIG. 15 is a cross sectional view of a HV gate driver IC that includes an epitaxial substrate, on which a gate driver circuit and a bootstrap diode are integrated.
Figure 16:
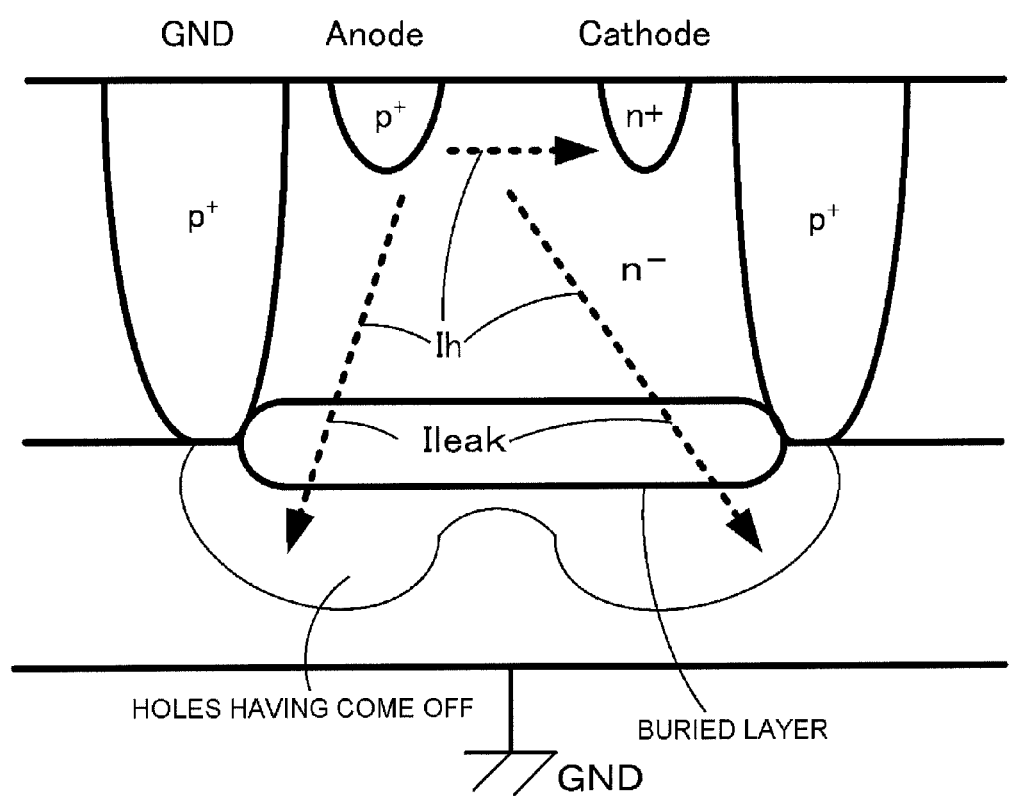
FIG. 16 is a cross sectional view of a main-circuit-driver circuit section that constitutes a conventional high-breakdown-voltage integrated circuit apparatus.
Figure 17:
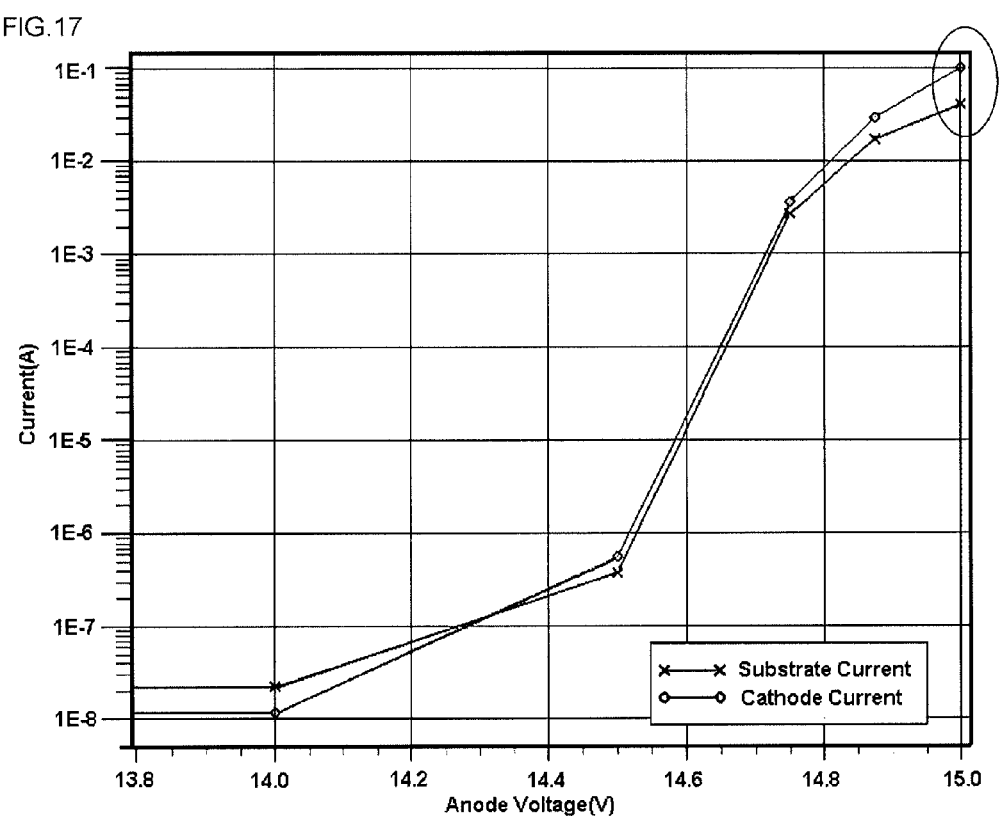
FIG. 17 is a graph showing a couple of curves relating the hole current with the anode voltage of a bootstrap diode (Db).

Lower-arm driver GDU-X is connected between VDD terminal 12 that is a high-potential-side terminal of VDD power supply 16 that is a low-voltage power supply and GND terminal 11 at the ground potential. A predetermined power supply voltage (VDD voltage) is fed to lower-arm driver GDU-X. As shown in FIGS. 12 and 13, a control signal for the upper arm is fed to upper-arm driver GDU-U from control unit CU via high-breakdown-voltage n-channel MOSFET 61 in level-shift unit LSU. A control signal for the lower arm is fed to lower-arm driver GDU-X directly from control unit CU.

Although not illustrated, upper-arm driver GDU-U is constituted of an upper-arm CMOS inverter, an upper-arm buffer amplifier, and an upper-arm control logic. Lower-arm driver GDU-X is constituted of a lower-arm CMOS inverter, a lower-arm buffer amplifier, and a lower-arm control logic.

In the configuration shown in FIG. 3, upper-arm output device Q1 and lower-arm output device Q4 are driven by upper-arm-driver GDU-U and lower-arm driver GDU-X, respectively, and are made to turn ON and OFF alternately.

Therefore, the potential at intermediate point terminal OUT (intermediate potential) repeats rising and falling between the ground potential (GND=VCC2L) and high-potential-side potential (VCC2H) of high voltage power supply VCC2 in association with the alternate ON and OFF of upper-arm output device Q1 and lower-arm output device Q4.

When upper-arm output device Q1 and lower-arm output device Q4 are conducting alternate ON and OFF, the bootstrap circuit (including bootstrap diode Db and bootstrap capacitor C1) operates as described below.

Bootstrap capacitor C1 is charged, only when upper-arm output device Q1 is OFF and the potential of intermediate point terminal OUT has been pulled down to the ground potential. Therefore, the ON-time of the low-side switch (lower-arm output device Q4) or the OFF-time of the high-side switch (upper-arm output device Q1) should be set to be long enough to completely replenish the electric charges pulled out from bootstrap capacitor C1 by high-side driver GDU-U.

The reverse withstand voltage of high-breakdown-voltage bootstrap diode Db is set to be equal to or higher than the voltage value obtained by adding the power supply voltage VCC2H of the main circuit to the power supply voltage VDD of the low-voltage power supply that feeds a control signal to the gate of the lower-arm output device.

In FIGS. 2(a) and 2(b), bootstrap diode Db is a pn-diode. The $n^+$ region 7 and $p^+$ region 6 in bootstrap diode Db, and p-type floating region 5 are formed in $n^-$ semiconductor layer 2c on cavity 3. The thickness of $n^-$ semiconductor layer 2a on cavity 3 that constitutes SON structure 35 is from 2 μm to 6 μm, e.g. 4 μm. The thickness of $n^-$ semiconductor layer 2b on $n^-$ semiconductor layer 2a is from 5 μm to 50 μm, e.g. 10 μm. The thickness of $n^-$ semiconductor layer 2c that occupies the entire region on cavity 3 is the sum of the thickness of $n^-$ semiconductor layer 2a and the thickness of $n^-$ semiconductor layer 2b on $n^-$ semiconductor layer 2a. The thickness of $n^-$ semiconductor layer 2c is around 14 μm, for example. As the thickness Q of cavity 3 is thicker and the width P of cavity 3 is wider, cavity 3 collapses more easily. Therefore, it is appropriate to set the thickness Q of cavity 3 to be around 6 μm and the width P thereof to be from 100 μm to 200 μm.

If one assumes a high-breakdown-voltage level shifter of the 1200 V class, it will be preferable to use $p^-$ substrate 1, the specific resistivity thereof is from 250 Ωcm to 400 Ωcm.

Now the method for forming cavity 3 for SON structure 35 will be described below.

A mask oxide film (thermal oxide film) is formed on $p^-$ substrate 1, that is a supporting base board. After patterning trench holes, trenches are formed by dry etching.

After the dry etching, the mask oxide film is removed by wet etching. The wafer is annealed in an inert gas atmosphere (e.g. a hydrogen gas atmosphere) at a temperature between 1000° C. and 1200° C.

After the anneal, the upper portions of the trench holes are closed and cavity 3 is formed.

Alternatively, cavity 3 may be formed by forming porous silicon by electrolytic etching and by annealing the porous silicon in an inert gas atmosphere at a high temperature.

After forming cavity 3, $n^-$ epitaxial layer 2 is grown. The impurity concentration in $n^-$ epitaxial layer 2 is set to be from $1 \times 10^{14}$ cm$^{-3}$ to $1 \times 10^{16}$ cm$^{-3}$.

For forming p-type floating region 5 in contact with cavity 3, for forming p-type GND region 4 connected to GND terminal 11, and for forming p⁺ region 6 and n⁺ region 7 of bootstrap diode Db above cavity 3 as shown in FIG. 2(b), phosphorus ion implantation and boron ion implantation are conducted after the pattering. The dose amounts are as follows. The dose amount for forming p⁺ region 6 in bootstrap diode Db is from $1\times10^{12}$ cm⁻² to $1\times10^{14}$ cm⁻². The dose amount for forming n⁺ region 7 in bootstrap diode Db is $1\times10^{15}$ cm⁻². The dose amount for forming p-type floating region 5 is from $1\times10^{12}$ cm⁻² to $5\times10^{14}$ cm⁻². The dose amount for forming p-type GND region 4 is from $1\times10^{12}$ cm⁻² to $1\times10^{14}$ cm⁻².

For diffusing p-type floating region 5 to cavity 3 and for diffusing p-type GND region 4 down to p⁻ substrate 1, the wafer is annealed at a temperature between 1100° C. and 1200° C. for 10 hr after the ion implantation steps. By p-type floating region 5, the leakage current caused by the holes flowing from p⁺ region 6, in bootstrap diode Db and connected to VDD terminal 12, to p⁻ substrate 1 connected to GND terminal 11 is suppressed.

No problem will be caused, even if p⁺ region 6 and n⁺ region 7 in bootstrap diode Db are diffused to cavity 3. However, p⁺ region 6 in bootstrap diode Db, p-type floating region 5, and p-type GND region 4 are spaced apart from each other so that p⁺ region 6, p-type floating region 5, and p-type GND region 4 may not be connected to each other. The spacing between p⁺ region 6 and n⁺ region 7 in bootstrap diode Db is set to be around 100 µm. The spacing between p⁺ region 6 and p-type floating region 5 is set to be wide enough so as not to cause any punch-through therebetween by the VDD power supply voltage (e.g. around 15 V).

The surface structure of the semiconductor layer is constituted of an anode region, that is p⁻ region 6; anode electrode 9 (connected to VDD terminal 12); a cathode region, that is n⁺ region 7; cathode electrode 10 (connected to U-VCC terminal 13); p-type GND region 4, that is a p⁺ region; and GND electrode 8 as shown in FIG. 1. The surface structure of the semiconductor layer is constituted also of LOCOS 41, that is a field oxide film; interlayer insulator film 42, that is a silicon oxide film of tetraethoxysilane (TEOS) or a silicon oxide film of boro-phosphosilicate glass (BPSG); and passivation film 43, that is a silicon nitride film, as shown in FIG. 2(b).

After forming cavity 3, the n-type region between p-type GND region 4 and p-type floating region 5, and the n-type region between p-type floating region 5 and n⁺ region 7, that is the cathode region of bootstrap diode Db, may be formed by growing a p⁻ epitaxial layer instead of growing n⁻ epitaxial layer 2, by implanting a phosphorus impurity, and by diffusing the implanted phosphorus impurity.

After implanting the impurity, an annealing treatment is conducted at a temperature between 1100° C. and 1200° C. for 10 hr to diffuse these n-type regions to the depth of cavity 3. The impurity concentration in the n-type regions is from $1\times10^{14}$ cm⁻³ to $1\times10^{17}$ cm⁻³. In this case, p-type floating region 5 in FIG. 2(b) is replaced by p⁻ epitaxial layer 2. Alternatively, a p⁻ epitaxial layer may be grown instead of n⁻ epitaxial layer 2 to bring the n-type regions between p-type GND region 4 and n⁺ region 7 into a unit, and p-type GND region 4 may be formed afterward with no problem.

Figure 4:
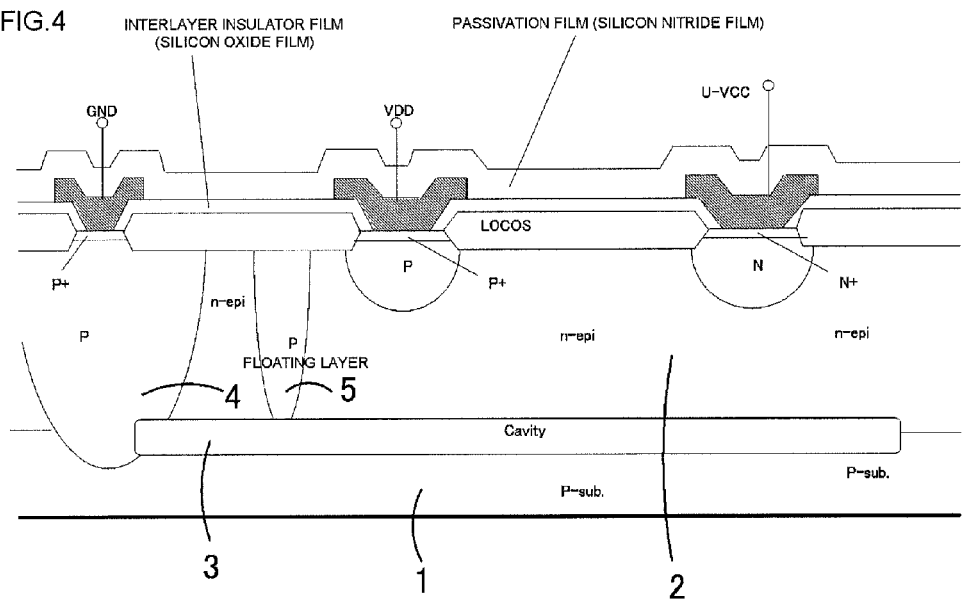
FIG. 4 is a cross sectional view of a high-breakdown-voltage integrated circuit apparatus, in which a cavity is in contact with a p-type GND region.

As shown in FIG. 4, cavity 3 may be formed such that cavity 3 is in contact with p-type GND region 4 with no problem.

By disposing p-type floating region 5 as described in connection with the first embodiment, the leakage current caused by the holes flowing to p⁻ substrate 1 is suppressed, when bootstrap capacitor C1 is charged. By suppressing the leakage current caused by the holes, it is possible to realize high-breakdown-voltage integrated circuit apparatus 100 that includes a very functional gate driver circuit, the electric power consumption thereof is small.

By forming bootstrap diode Db on p⁻ substrate 1 (integration), the area of an insulating baseboard with electrically conductive patterns formed thereon such as a printed circuit board is reduced as compared with the case, in which bootstrap diode Db is attached externally.

Since cavity 3 may be formed in the island region (stripe-shaped ring region) of bootstrap diode Db, cavity 3 hardly affects the bending of the wafer (p⁻ substrate 1).

Since it is enough to add the step of forming trench holes (including mask oxidation, patterning, and trench etching), the step of annealing in a hydrogen atmosphere, and the step of epitaxial growth, the manufacturing costs are reduced as compared with the manufacture of a high-breakdown-voltage integrated circuit apparatus according to the following fifth embodiment that employs a SOI substrate.

Figure 5:
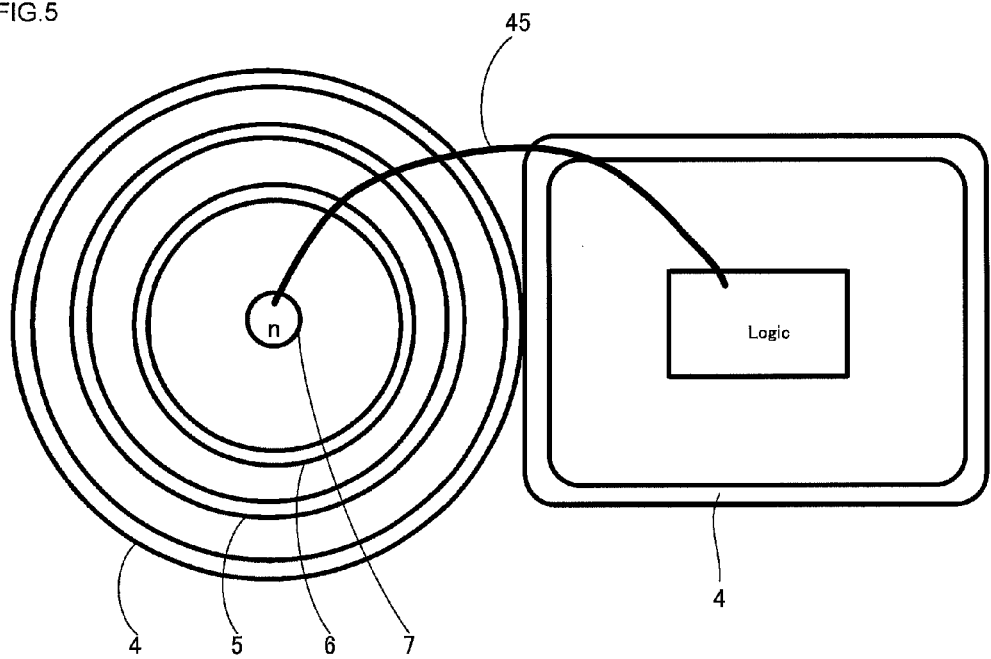
FIG. 5 is a top plan view of a high-breakdown-voltage integrated circuit apparatus, in which the logic section on the high-side is arranged outside the p-type GND region.

FIG. 5 is the top plan view of a high-breakdown-voltage integrated circuit apparatus, in which a logic section on the high-side is arranged outside p-type GND region 4.

The n⁺ region 7, that is the cathode region of bootstrap diode Db, is connected to the logic section on the high-side by bonding wire 45. The logic section on the high-side is surrounded by the other p-type GND region 4 that is different from p-type GND region 4 surrounding bootstrap diode Db. The other logic section is constituted of CMOS circuit 33 and such constituent elements shown in FIG. 1. Gate driver unit GDU-U shown in FIG. 13 is included in the logic section.

The range, in which cavity 3 is formed, is from p-type floating region 5 to n⁺ region 7 at the minimum. Cavity 3 may be extended below the logic section on the high-side. As cavity 3 is wider, the leakage current caused by holes flowing to p⁻ substrate 1 is smaller.

Now the thickness of cavity 3 will be described below. Generally, the breakdown voltage Vbr of the dielectric-separation semiconductor device that does not impair the RESURF effects is expressed by the following equation (1) converted from the Poisson equation.

$$Vbr = Ecr \times (d/2 + Torr \times \in si/\in ox) \tag{1}$$

Here, Ecr is the critical electric field, d the thickness of an n⁻ semiconductor layer, Tox the thickness of a dielectric layer, ∈si the relative dielectric permeability of silicon, and ∈ox the relative dielectric permeability of a dielectric layer.

When the dielectric layer is cavity 3, the dielectric permeability $\in_{cavity}$ of cavity 3 corresponding to ∈ox is 1. Ecr is $3\times10^5$V/cm, d is 10 µm, and ∈si is 11.7. If one substitutes $T_{cavity}=4$ µm, that is the cavity 3 thickness, for Tox, Vbr will be 1550 V. This cavity 3 thickness is around one fourth of the oxide film thickness, when a SOI substrate is used.

It is required for level shift unit LSU and high-breakdown-voltage bootstrap diode Db mounted on high-breakdown-voltage integrated circuit apparatus 100 to exhibits a breakdown voltage of around 1500 V even at a conservative estimate in the case, in which the product specification is 1200 V. In the above estimate, specific resistance variations of the n⁻ semiconductor layer (n⁻ epitaxial layer 2), variations of the cavity 3 thickness, and variations of the practical breakdown voltages of power transistors Q1 and Q4 attached externally are considered.

One knows from the equation (1) that it is effective to thicken the n⁻ semiconductor layer (n⁻ epitaxial layer 2) or the dielectric layer for providing a dielectric-separation semiconductor device with a higher breakdown voltage. However, if cavity 3 is made to be too thick in the case, in which cavity 3 is used for the dielectric layer, cavity 3 will collapse. Therefore, it is preferable for cavity 3 to be from 4 μm to 6 μm in thickness.

The p⁺ region 6 that works as an anode region and n⁺ region 7 that works as a cathode region may be formed such that p⁺ region 6 and n⁺ region 7 are in contact with cavity 3 with no problem.

Second Embodiment

Figure 6:
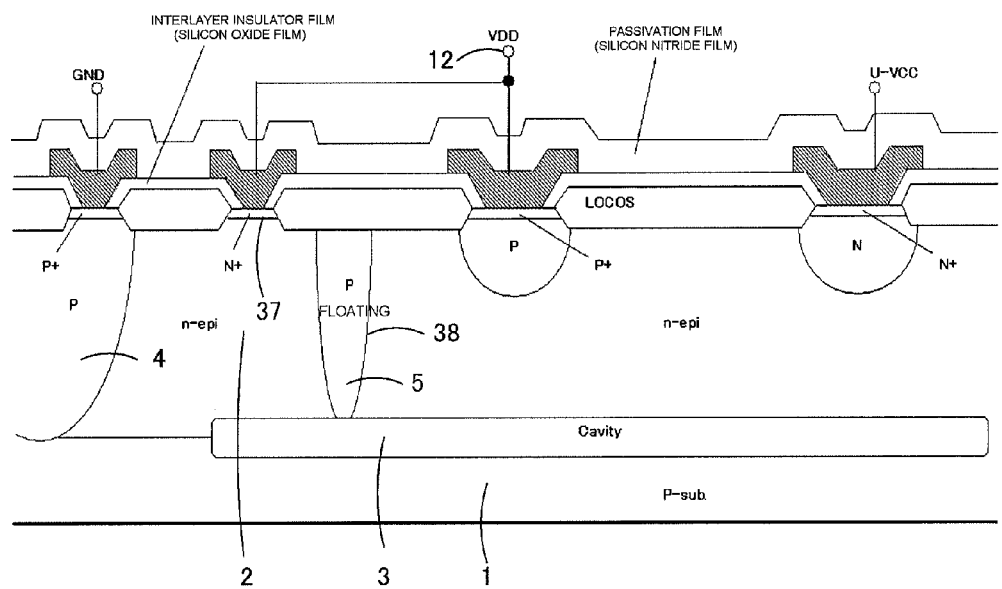
FIG. 6 is a cross sectional view of high-breakdown-voltage integrated circuit apparatus 200 according to a second embodiment of the invention.

FIG. 6 is the cross sectional view of high-breakdown-voltage integrated circuit apparatus 200 according to a second embodiment of the invention.

FIG. 6 is the cross sectional view, in which n⁻ epitaxial layer 2 between p-type floating region 5 and p-type GND region 4 is connected to VDD terminal 12 via n⁺ region 37, that is a contact region.

The n⁻ epitaxial layer 2 between p-type floating region 5 and p-type GND region 4 connected to GND terminal 11 is connected to VDD terminal 12 via n⁺ region 37, that is a contact region.

In addition to the effects, which high-breakdown-voltage integrated circuit apparatus 100 according to the first embodiment exhibits, the electrons caused by the avalanche of the pn-junction between p-type GND region 4 and n⁻ epitaxial layer 2 are prevented from entering p-type floating region 5, when a positive voltage surge is inputted to VDD terminal 12. Since the electrons are prevented from entering the p-type floating region 5, the potential of p-type floating region 5 is prevented from lowering and pn-junction 38 between p-type floating region 5 and n⁻ epitaxial layer 2 between p-type floating region 5 and p⁺ region 6 is prevented from causing an avalanche in the normal mode of operation. As a result, the current consumption in the normal mode of operation is reduced.

Third Embodiment

Figure 7:
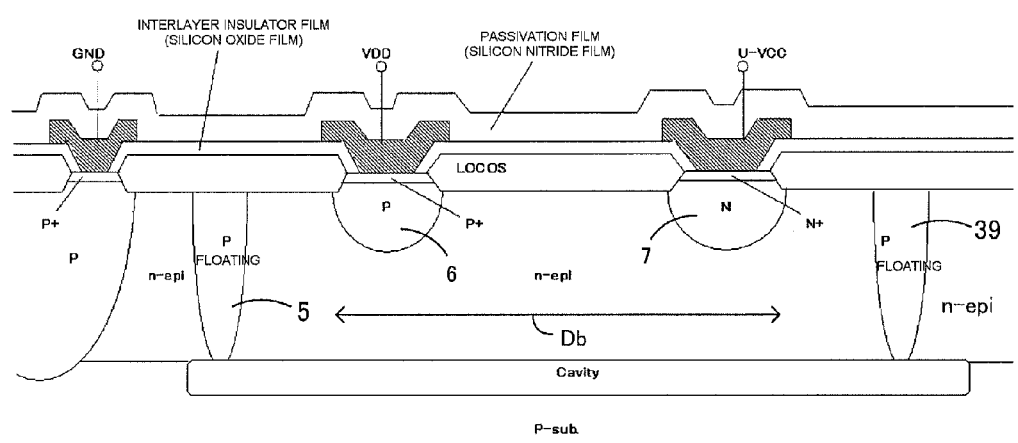
FIG. 7 is a cross sectional view of high-breakdown-voltage integrated circuit apparatus 300 according to a third embodiment of the invention.

FIG. 7 is the cross sectional view of high-breakdown-voltage integrated circuit apparatus 300 according to a third embodiment of the invention.

In FIG. 7, p-type floating region 39 is also formed on the side of a cathode region, that is n⁺ region 7 of bootstrap diode Db.

Additional p-type floating region 39 facilitates suppressing the leakage current caused by the holes flowing from p⁺ region 6 (anode region) of bootstrap diode Db to p⁻ substrate 1.

Fourth Embodiment

Figure 8:
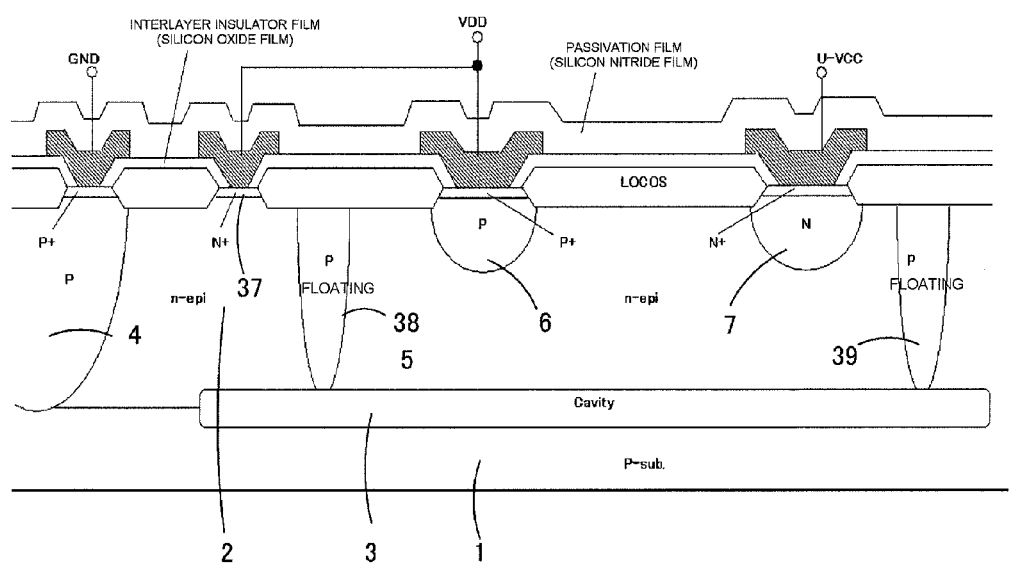
FIG. 8 is a cross sectional view of high-breakdown-voltage integrated circuit apparatus 400 according to a fourth embodiment of the invention.

FIG. 8 is the cross sectional view of high-breakdown-voltage integrated circuit apparatus 400 according to a fourth embodiment of the invention.

In FIG. 8, p-type floating region 5 is formed also on the side of the cathode region, that is n⁺ region 7 of bootstrap diode Db.

Apparatus 400 is different from apparatus 300 according the third embodiment, in that n⁻ epitaxial layer 2 between p-type floating region 5 and p-type GND region 4 connected to GND terminal 11 is connected to VDD terminal 12 via n⁺ region 37, that is a contact region.

In addition to the effects, which high-breakdown-voltage integrated circuit apparatus 300 according to the third embodiment exhibits, the electrons caused by the avalanche of the pn-junction between p-type GND region 4 and n⁻ epitaxial layer 2 are prevented from entering p-type floating region 5, when a positive voltage surge is inputted to VDD terminal 12. Since the electrons are prevented from entering the p-type floating region 5, the potential of p-type floating region 5 is prevented from lowering and pn-junction 38 between p-type floating region 5 and n⁻ epitaxial layer 2 is prevented from causing an avalanche in the normal mode of operation. As a result, the current consumption in the normal mode of operation is reduced.

Fifth Embodiment

Figure 9:
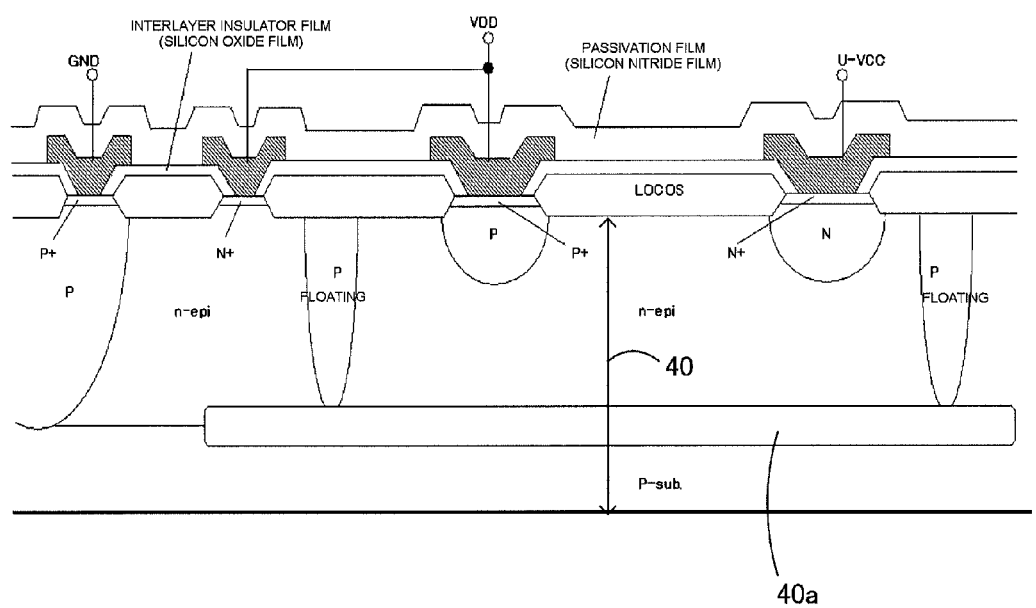
FIG. 9 is a cross sectional view of high-breakdown-voltage integrated circuit apparatus 500 according to a fifth embodiment of the invention.

FIG. 9 is the cross sectional view of high-breakdown-voltage integrated circuit apparatus 500 according to a fifth embodiment of the invention.

Apparatus 500 according to the fifth embodiment is different from apparatus 100 according to the first embodiment in that partial SOI substrate 40 is used in apparatus 500 in substitution for partial SON structure 35. It is necessary for the thickness of oxide film 40a, that is an insulator film, to be around 15 μm (calculated using ∈ox=3.9) at a breakdown voltage of around 1500 V. The thickness of 15 μm is around four times as thick as cavity 3 for the SON structure, increasing the manufacturing costs. A SOI substrate, the insulator thereof is an oxide film on the entire substrate surface may be used with no problem.

Sixth Embodiment

Figure 10:
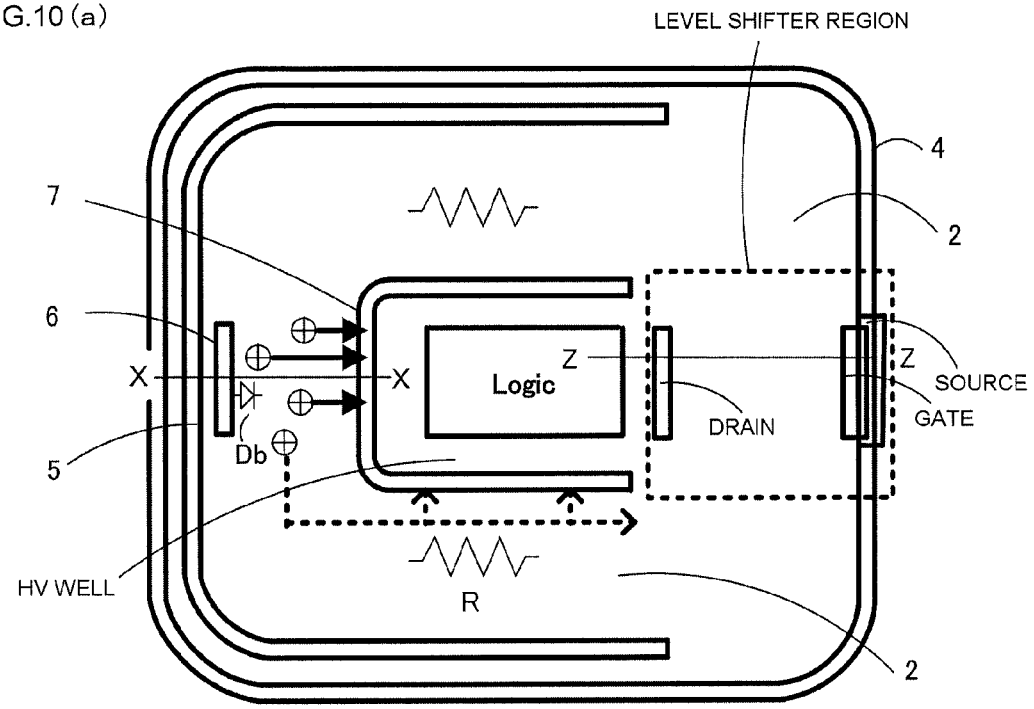
FIG. 10(a) is a top plan view of high-breakdown-voltage integrated circuit apparatus 600 according to a sixth embodiment of the invention.
FIG. 10(b) is a cross sectional view along the line segment Z-Z in FIG. 10(a).
Figure 10:
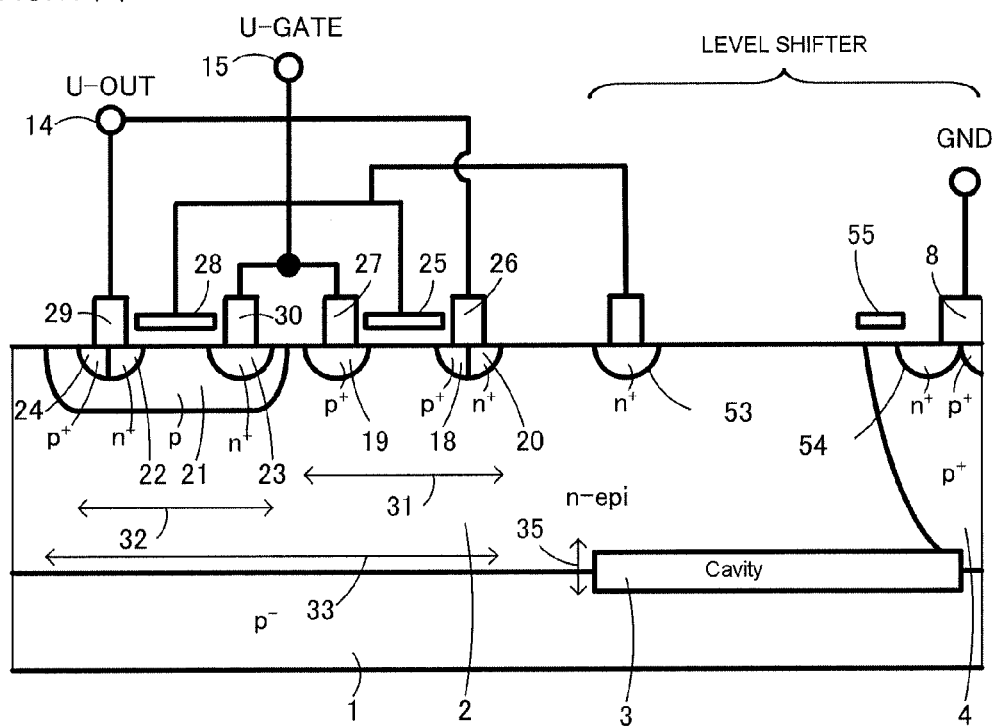

FIG. 10(a) is the top plan view of high-breakdown-voltage integrated circuit apparatus 600 according to a sixth embodiment of the invention. FIG. 10(b) is the cross sectional view along the line segment Z-Z in FIG. 10(a). FIG. 10(a) is the top plan view of a region, in which a logic section and a level shift circuit are formed. Bootstrap diode Db is formed on the other side of the level shift circuit across the logic section.

The p-type GND region 4 surrounds the entire region. The p-type floating region 5 surrounds bootstrap diode Db and the logic section except the level-shift-circuit side thereof. The n⁺ region 7, that is a cathode region, is formed such that n⁺ region 7 is facing to p-type floating region 5. The p⁺ region 6, that is an anode region, is formed on the line segment X-X such that p⁺ region 6 is facing to n⁺ region 7. The p⁺ region 6 is set to be much shorter than n⁺ region 7.

Cavity 3 for a SON structure is formed under the region, in which the level shift circuit is formed, such that cavity 3 is in contact with p-type GND region 4. Cavity 3 is formed also on the boundary between p⁻ substrate 1 and n⁻ epitaxial layer 2 between n⁺ region 7 and p-type floating region 5. It is desirable to form cavity 3 circularly such that cavity 3 surrounds the logic circuit. Cavity 3 may be formed in the entire area in p-type GND region 4 with no problem.

Most of the holes injected from p⁺ region 6 to n⁻ epitaxial layer 2 are absorbed to n⁺ region 7. Some of the holes flow through n⁻ epitaxial layer 2, under which cavity 3 is formed, between n⁺ region 7 and p-type floating region 5 for a long distance (against high resistance R). Since the resistance of the n⁻ epitaxial layer 2 portion, under which cavity 3 is formed, between n⁺ region 7 and p-type floating region 5, is high, some of the holes are also absorbed to n⁺ region 7. Since cavity 3 is formed under the region, in which the level shift circuit is formed but p-type floating region 5 is not, the leakage current caused by the holes flowing top⁻ substrate 1 is extremely small.

In FIG. 10(b), drain 53, source 54, and gate 55 of a MOSFET that constitutes a level shift circuit are shown.

A list and description of the references numerals and symbols used herein are as noted below:

1: p⁻ substrate
2: n⁻ epitaxial layer
3: Cavity
4: p-type GND region
5, 39: p-type floating region
6: p⁺ region (Anode region)
7: n⁺ region (Cathode region)
8: GND electrode
9: Anode electrode
10: Cathode electrode
11: GND terminal
12: VDD terminal
13: U-VCC terminal
14: U-OUT terminal
15: U-GATE terminal
16: VDD power supply
18: p-type source region
19: p-type drain region
20: n-type contact region
21: p-type offset region
22: n-type source region
23: n-type drain region
24: p-type contact region
25, 28: Gate electrode
26, 29: Source electrode
27, 30: Drain electrode
31: p-channel MOSFET
32: n-channel MOSFET
33: CMOS circuit
35: SON structure
40: Partial SOI substrate
41: LOCOS
42: Interlayer insulator film
43: Passivation film
45: Bonding wire
51, 52: Broken line
53: Drain
54: Source
55: Gate
100, 200, 300, 400, 500:
High-breakdown-voltage integrated circuit apparatus
Db: Bootstrap diode
C1: Bootstrap capacitor Although a few embodiments have been shown and described, it would be appreciated by those skilled in the art that changes may be made in these embodiments without departing from the principles and spirit of the invention, the scope of which is defined in the claims and their equivalents.

What is claimed is:

1. A semiconductor apparatus comprising:
   a semiconductor substrate of a p-type;
   a semiconductor layer of an n-type formed on the semiconductor substrate;
   a separation region of the p-type formed in the semiconductor layer from a surface of the semiconductor layer to a boundary between the semiconductor layer and the semiconductor substrate, the separation region zoning an island region;
   a semiconductor device formed in the surface of the island region;
   a cathode region of the n-type formed in a surface portion of the island region, the cathode region being between the separation region and the semiconductor device, the cathode region being spaced apart from the separation region and the semiconductor device;
   an anode region of the p-type formed in the surface portion of the island region, the anode region being between the separation region and the cathode region, the anode region being spaced apart from the separation region and the cathode region;
   an insulating separation region positioned below the cathode region, below the anode region, and below a region between the cathode region and the anode region, the insulating separation region being located on or at least partially in the semiconductor substrate; and
   a first floating region of the p-type formed between the separation region and the anode region, the first floating region being spaced apart from the separation region and the anode region, the first floating region being formed in the semiconductor layer between the surface thereof and the insulating separation region and formed such that the first floating region reaches the insulating separation region from the surface of the semiconductor layer, the semiconductor substrate and the separation region being biased at a potential lower than potentials of the anode region and the cathode region.

2. The semiconductor apparatus according to claim 1, wherein
   the insulating separation region is extended to the separation region.

3. The semiconductor apparatus according to claim 2, wherein the insulating separation region comprises a cavity.

4. The semiconductor apparatus according to claim 3,
   the semiconductor apparatus further comprising a second floating region of the p-type, the second floating region being between the cathode region and the semiconductor device, the second floating region being spaced apart from the cathode region and the semiconductor device, the second floating region being formed in the semiconductor layer between the surface thereof and the insulating separation region.

5. The semiconductor apparatus according to claim 2,
   the semiconductor apparatus further comprising a second floating region of the p-type, the second floating region being between the cathode region and the semiconductor device, the second floating region being spaced apart from the cathode region and the semiconductor device, the second floating region being formed in the semiconductor layer between the surface thereof and the insulating separation region.

6. The semiconductor apparatus according to claim 1, wherein
   the insulating separation region comprises a cavity.

7. The semiconductor apparatus according to claim 6,
   the semiconductor apparatus further comprising a second floating region of the p-type, the second floating region being between the cathode region and the semiconductor device, the second floating region being spaced apart from the cathode region and the semiconductor device, the second floating region being formed in the semiconductor layer between the surface thereof and the insulating separation region.

8. The semiconductor apparatus according to claim 6, wherein the cavity extends at least from a position below the cathode region, through a position below a region between the cathode region and the anode region, and at least to a position below the anode region.

9. The semiconductor apparatus according to claim 8, wherein the cavity is contiguous with the first floating region, with the semiconductor substrate, and with the semiconductor layer.

10. The semiconductor apparatus according to claim 8, wherein the cavity has a thickness from 4 μm to 6 μm.

11. The semiconductor apparatus according to claim 6, wherein the semiconductor layer and the semiconductor substrate are electrically connected with each other through the boundary between the semiconductor layer and the semiconductor substrate.

12. The semiconductor apparatus according to claim 1, the semiconductor apparatus further comprising a second floating region of the p-type, the second floating region being between the cathode region and the semiconductor device, the second floating region being spaced apart from the cathode region and the semiconductor device, the second floating region being formed in the semiconductor layer between the surface thereof and the insulating separation region.

13. The semiconductor apparatus according to claim 1, the semiconductor apparatus further comprising a contact region of the n-type formed in the surface portion of the semiconductor layer between the first floating region and the separation region.

14. The semiconductor apparatus according to claim 13, wherein
the contact region is biased at a potential the same with a potential, at which the anode region is biased.

15. A semiconductor apparatus comprising:
a semiconductor substrate of a p-type;
a semiconductor layer of an n-type formed on the semiconductor substrate;
a first separation region of the p-type formed in the semiconductor layer from a surface of the semiconductor layer to a boundary between the semiconductor layer and the semiconductor substrate, the first separation region zoning a first island region;
a second separation region of the p-type formed in the semiconductor layer from the surface of the semiconductor layer to the boundary between the semiconductor layer and the semiconductor substrate, the second separation region zoning a second island region, the second island region being spaced apart from the first island region;
a cathode region of the n-type formed in a surface portion of the first island region;
an anode region of the p-type formed in the surface portion of the first island region, the anode region being between the first separation region and the cathode region, the anode region being spaced apart from the first separation region and the cathode region;
an insulating separation region positioned below the cathode region, below the anode region, and below a region between the cathode region and the anode region, the insulating separation region being located on or at least partially in the semiconductor substrate;
a first floating region of the p-type formed between the first separation region and the anode region, the first floating region being spaced apart from the first separation region and the anode region, the first floating region being formed in the semiconductor layer between the surface thereof and the insulating separation region and formed such that the first floating region reaches the insulating separation region from the surface of the semiconductor layer; and
a semiconductor device in the second island region, the semiconductor device being formed in the surface of the semiconductor layer,
the semiconductor substrate and the first separation region being biased at a potential lower than potentials of the anode region and the cathode region.

16. The semiconductor apparatus according to claim 15, wherein
the insulating separation region is extended to the first separation region.

17. The semiconductor apparatus according to claim 15, wherein
the insulating separation region comprises a cavity.

18. The semiconductor apparatus according to claim 15, the semiconductor apparatus further comprising a bonding wire that connects the cathode region and the semiconductor device electrically.

19. The semiconductor apparatus according to claim 15, the semiconductor apparatus further comprising a contact region of the n-type formed in the surface portion of the semiconductor layer between the first floating region and the first separation region.

20. The semiconductor apparatus according to claim 19, wherein
the contact region is biased at a potential the same with a potential, at which the anode region is biased.

* * * * *